United States Patent
Kato (10) Patent No.: US 8,670,051 B2
(45) Date of Patent: Mar. 11, 2014

(54) SOLID-STATE IMAGE SENSOR AND CAMERA HAVING IMPROVED SENSITIVITY AND COLOR SEPARATION CHARACTERISTICS

(75) Inventor: Taro Kato, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 197 days.

(21) Appl. No.: 13/180,653

(22) Filed: Jul. 12, 2011

(65) Prior Publication Data

US 2012/0033116 A1  Feb. 9, 2012

(30) Foreign Application Priority Data

Aug. 6, 2010  (JP) ................................. 2010-178076

(51) Int. Cl.
  *H04N 3/14*  (2006.01)
(52) U.S. Cl.
  USPC ............................ 348/272; 348/294; 348/273
(58) Field of Classification Search
  None
  See application file for complete search history.

(56) References Cited

U.S. PATENT DOCUMENTS

| | | | | |
|---|---|---|---|---|
| 2005/0122417 | A1 | 6/2005 | Suzuki | 348/340 |
| 2008/0265349 | A1* | 10/2008 | Kasano et al. | 257/432 |
| 2009/0189060 | A1* | 7/2009 | Noda | 250/214.1 |
| 2010/0237451 | A1* | 9/2010 | Murakoshi | 257/432 |
| 2010/0245645 | A1* | 9/2010 | Kikuchi | 348/308 |

FOREIGN PATENT DOCUMENTS

| | | |
|---|---|---|
| JP | 63-014466 A | 1/1988 |
| JP | 2005-142510 A | 6/2005 |
| JP | 2006-120800 A | 5/2006 |

* cited by examiner

*Primary Examiner* — James Hannett
*Assistant Examiner* — Angel L Garces-Rivera
(74) *Attorney, Agent, or Firm* — Fitzpatrick, Cella, Harper & Scinto (57) ABSTRACT

A solid-state image sensor includes first-color pixels and second-color pixels, each of the first-color pixels including a first antireflection film and a first color filter, and each of the second-color pixels including a second antireflection film and a second color filter, wherein the solid-state image sensor satisfies $$T1(\lambda 12) \leq 0.95 \cdot Tmax1, \text{ and}$$

$$T2(\lambda 12) \leq 0.95 \cdot Tmax2$$

where $\lambda 1$ represents a wavelength at which a transmittance of the first color filter is maximized, $\lambda 2$ represents a wavelength at which a transmittance of the second color filter is maximized, and $\lambda 12$ represents a central wavelength between wavelengths $\lambda 1$ and $\lambda 2$, $T1(\lambda)$ and $T2(\lambda)$ respectively represent transmittances of the first antireflection film and the second antireflection film when a wavelength is represented by $\lambda$, and Tmax1 and Tmax2 represent maximum values of the transmittances $T1(\lambda)$ and $T2(\lambda)$, respectively.

17 Claims, 6 Drawing Sheets

SOLID-STATE IMAGE SENSOR AND CAMERA HAVING IMPROVED SENSITIVITY AND COLOR SEPARATION CHARACTERISTICS

BACKGROUND OF THE INVENTION

1. Field of the Invention

The present invention relates to a solid-state image sensor and a camera.

2. Description of the Related Art

A solid-state image sensor used in a digital video camera, a digital still camera, or the like is required to undergo constant improvement in sensitivity. Japanese Patent Laid-Open No. 63-14466 discloses a technique for decreasing loss of incident light due to reflection from the surface of a photoelectric conversion element by using an antireflection film on the surface of the photoelectric conversion element. Japanese Patent Laid-Open No. 2005-142510 discloses a technique for setting the thicknesses of antireflection films provided under color filters for red, green, and blue lights so that the reflectivity is minimized in the respective wavelength region.

The spectral characteristics of the whole solid-state image sensor are determined by multiplying the spectral transmittance of a color filter by that of an antireflection film. As disclosed in Japanese Patent Laid-Open No. 2005-142510, if the thicknesses of the antireflection films for red, green, and blue lights are simply set so that the reflectivity is minimized in the respective wavelength region, the color separation characteristics may degrade.

SUMMARY OF THE INVENTION

The present invention provides an advantageous technique with respect to the sensitivity and color separation characteristics.

One of the aspects of the present invention provides a solid-state image sensor including a plurality of pixels, the plurality of pixels including first-color pixels and second-color pixels, each of the first-color pixels including a first antireflection film and a first color filter, and each of the second-color pixels including a second antireflection film and a second color filter, wherein the solid-state image sensor satisfies $$T1(\lambda 12) \leq 0.95 \cdot T\max 1, \text{ and}$$

$$T2(\lambda 12) \leq 0.95 \cdot T\max 2$$

where $\lambda 1$ represents a wavelength at which a transmittance of the first color filter is maximized, $\lambda 2$ represents a wavelength at which a transmittance of the second color filter is maximized, and $\lambda 12$ represents a central wavelength between wavelengths $\lambda 1$ and $\lambda 2$, $T1(\lambda)$ and $T2(\lambda)$ respectively represent transmittances of the first antireflection film and the second antireflection film when a wavelength is represented by $\lambda$, and $T\max 1$ and $T\max 2$ represent maximum values of the transmittances $T1(\lambda)$ and $T2(\lambda)$, respectively.

Further features of the present invention will become apparent from the following description of exemplary embodiments with reference to the attached drawings.

DESCRIPTION OF THE EMBODIMENTS

Problems associated with the present invention will be described first. A solid-state image sensor 300 shown in FIG. 8 has a silicon substrate 301, photoelectric conversion portions 302 formed within the silicon substrate 301, and an interlayer insulation film 303 which is formed on the silicon substrate 301 and made of a transmissive material. A planarizing layer (not shown), color filters (B pixel: 305a, G pixel: 305b, and R pixel: 305c), and micro-lenses 306 are formed on the upper surface of the interlayer insulation film 303 in the order named. Upon passing through the micro-lenses 306, light is separated into three primary colors, that is, blue light (B), green light (G), and red light (R) by the color filters 305a, 305b, and 305c to enter the photoelectric conversion portions 302. An antireflection film 307 formed by a silicon oxide film ($SiO_2$ film) and a silicon nitride film (SiN film) is interposed between the interlayer insulation film 303 and the silicon substrate 301. The antireflection film 307 prevents reflection of incident light at the interface between the silicon substrate 301 and the interlayer insulation film 303 using the difference between the refractive indexes of the interlayer insulation film 303 and the silicon substrate 301, thereby contributing to sensitivity improvement.

Figure 9:
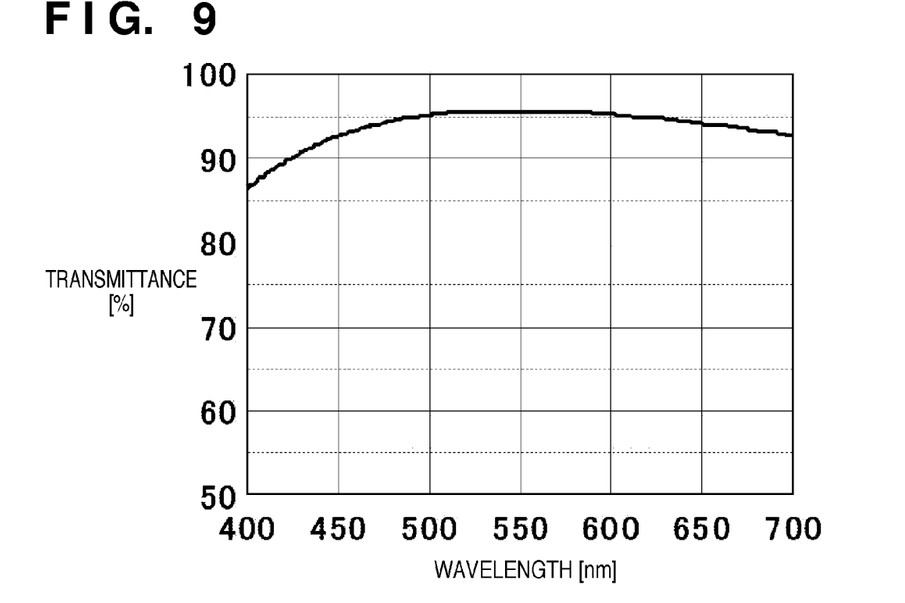
FIG. 9 is a graph showing the spectral characteristics of an antireflection film according to the Comparative Example.

The antireflection film 307 can be formed by, for example, sequentially arranging a 100 nm-thick $SiO_2$ film and a 50 nm-thick SiN film on the surface of the silicon substrate 301. FIG. 9 shows the spectral transmittance of the antireflection film 307 with such a structure. Referring to FIG. 9, the abscissa indicates the wavelength and the ordinate indicates the transmittance. The thickness of the antireflection film 307 with the transmittance shown in FIG. 9 is set so that the reflectivity is minimized with respect to a wavelength region around, for example, 550 nm. This makes it impossible to sufficiently reduce reflection of incident light in the whole wavelength region of visible light.

Figure 10:
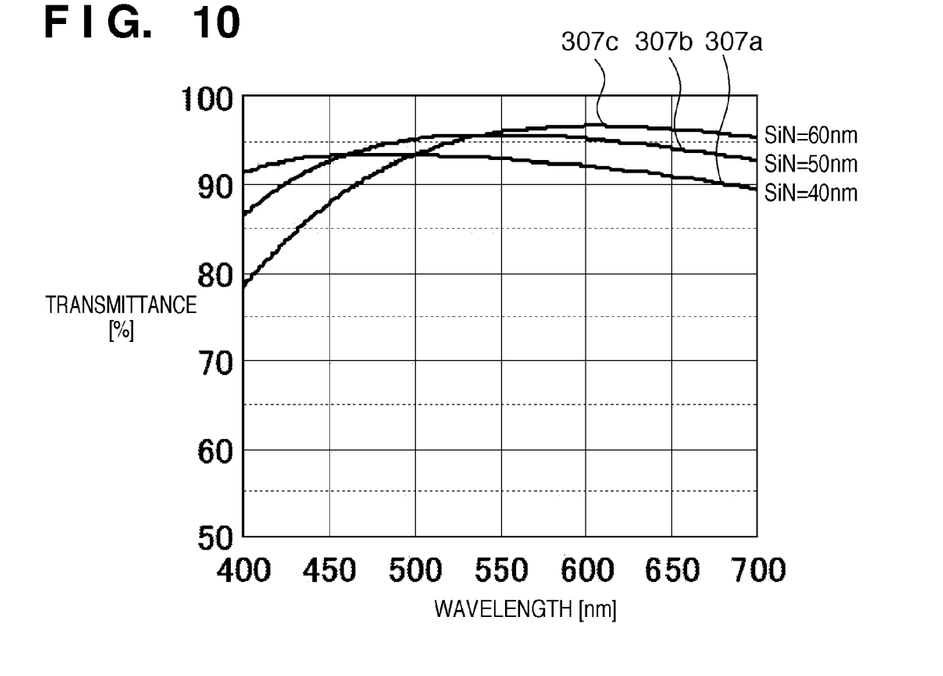
FIG. 10 is a graph showing the spectral characteristics of antireflection films according to the Comparative Example.

As disclosed in Japanese Patent Laid-Open No. 2005-142510, it is useful to set the thickness of the antireflection film 307 for each of R (red), G (green), and B (blue) pixels. For example, consider the antireflection film 307 having the $SiO_2$ film and SiN film on the surface of the silicon substrate 301 in the order named. Assume that the thickness of the $SiO_2$ film is commonly set to 100 nm for the R, G, and B pixels, the thickness of the SiN film of an R pixel antireflection film is set to 60 nm, the thickness of the SiN film of a G pixel antireflection film is set to 50 nm, and the thickness of the SiN film of a B pixel antireflection film is set to 40 nm. In this case, reference numeral 307a denotes an R pixel antireflection film; 307b, a G pixel antireflection film; and 307c, a B pixel antireflection film. FIG. 10 shows the spectral transmittances of the antireflection films 307a, 307b, and 307c. Referring to FIG. 10, the abscissa indicates the wavelength and the ordinate indicates the transmittance. Such film arrangement can improve the sensitivity as compared with antireflection films having the same thickness.

Figure 11:
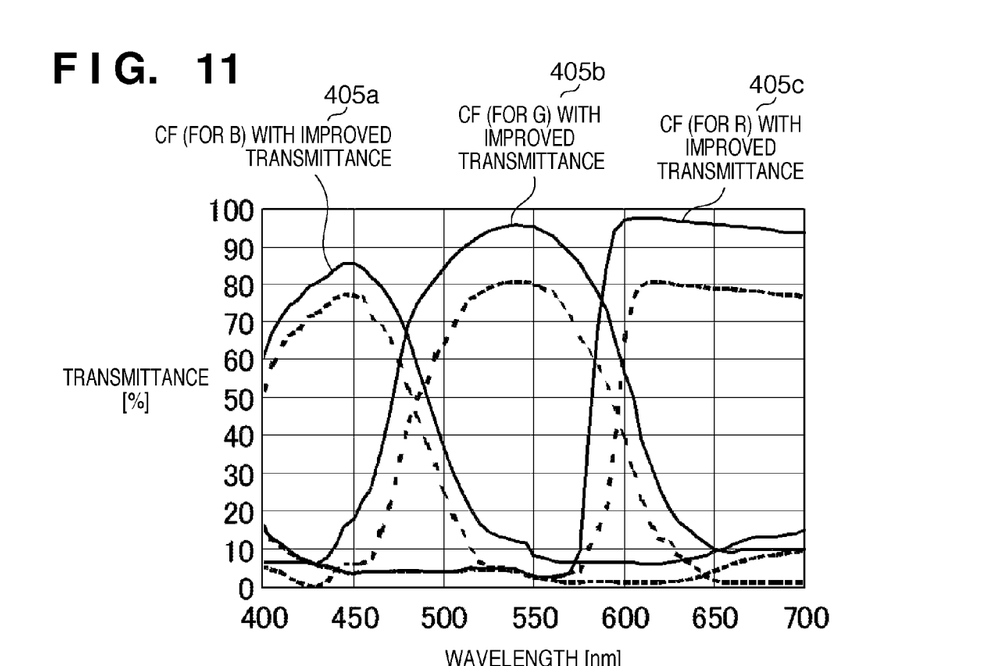
FIG. 11 is a graph showing the spectral characteristics of color filters according to the Comparative Example.
Figure 12:
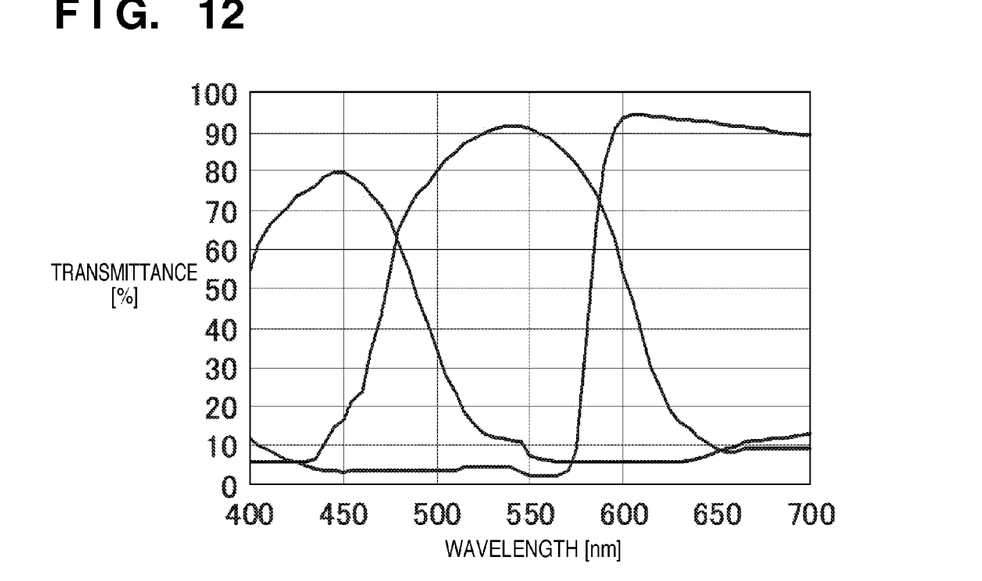
FIG. 12 is a graph showing the spectral characteristics of the solid-state image sensor according to the Comparative Example.

If, however, only the reflectivity of an antireflection film is decreased, there is a limit to the improvement in sensitivity obtained. To further improve the sensitivity, it is desired to increase the transmittance of a color filter (CF). FIG. 11 shows the spectral transmittances of B, G, and R pixel color filters 405a, 405b, and 405c with improved transmittances. Referring to FIG. 11, the abscissa indicates the wavelength and the ordinate indicates the transmittance. As the transmittance of a color filter improves, the spectral characteristics change from a dotted line to a solid line as shown in FIG. 11. At this time, while the maximum value of the transmittance on each wavelength increases, the transmission band of each of the B, G, and R pixel color filters 405a, 405b, and 405c changes. Note that the spectral characteristics of the whole solid-state image sensor are determined by multiplying the spectral transmittance of a color filter by that of the antireflection film. If the above-described antireflection films 307a, 307b, and 307c are used, the spectral characteristics of the whole solid-state image sensor are as shown in FIG. 12, and an overlap between the transmission bands of B and G pixel color filters becomes large. An overlap between the transmission bands of G and R pixel color filters also becomes large. This means that the color separation characteristics are poor.

Figure 1:
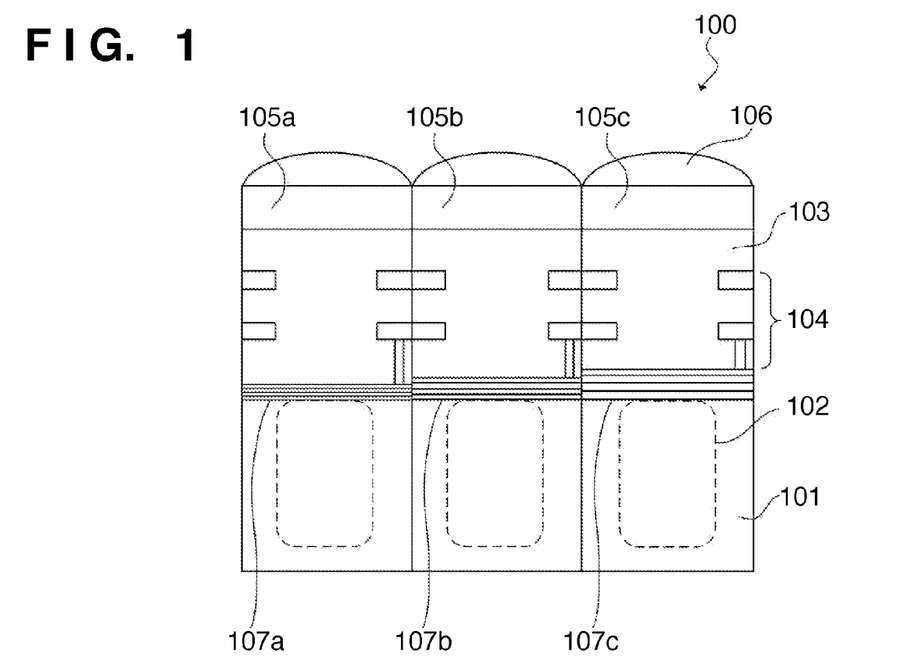
FIG. 1 is a schematic sectional view showing the arrangement of a solid-state image sensor according to the first embodiment.
Figure 5:
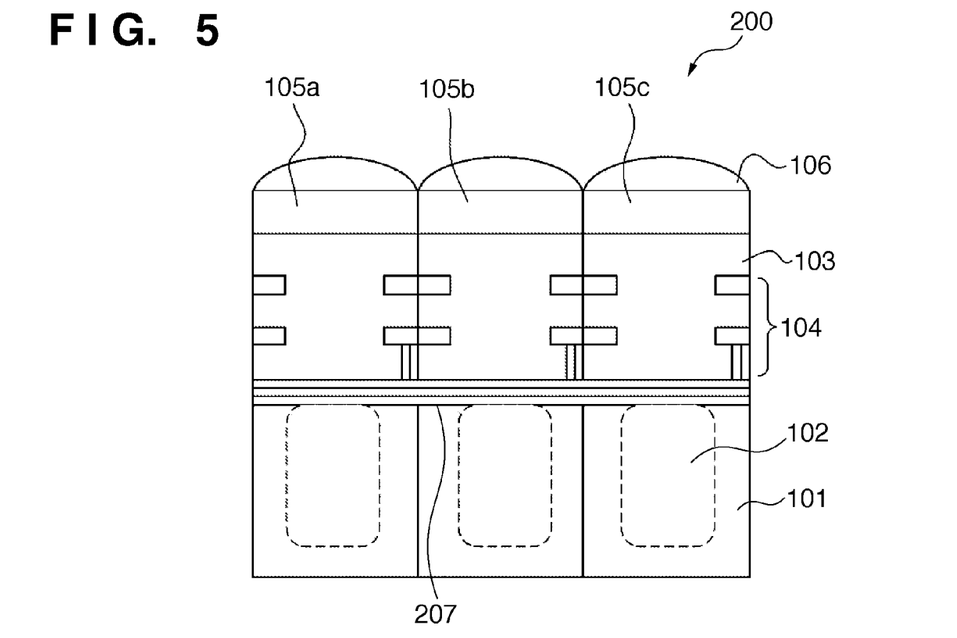
FIG. 5 is a schematic sectional view showing the arrangement of a solid-state image sensor according to the second embodiment.
Figure 8:
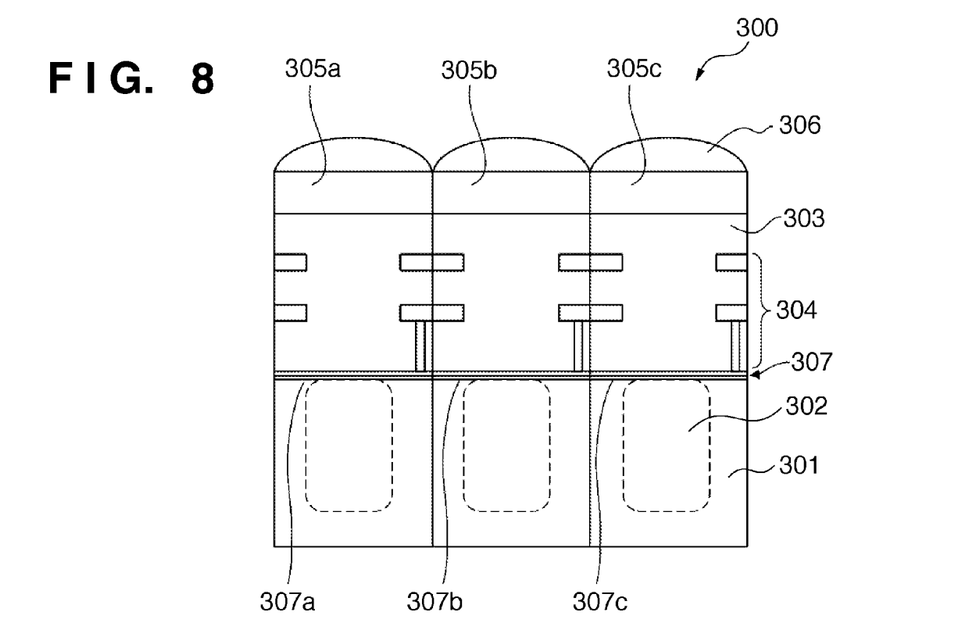
FIG. 8 is a schematic sectional view showing the arrangement of a solid-state image sensor according to a Comparative Example.

The present invention has as its object to provide an advantageous technique with respect to the sensitivity and color separation characteristics. Exemplary embodiments of the solid-state image sensor of the present invention will be described below. Assume that components given a common reference numeral have a common function. Referring to FIGS. 1, 5, and 8, red, green, and blue pixels are arranged in a line for descriptive convenience. In fact, however, a red pixel (R pixel), a green pixel (G pixel), and a blue pixel (B pixel) can be arranged according to an arrangement such as a Bayer arrangement.

First Embodiment

A solid-state image sensor 100 according to the first embodiment of the present invention will be explained with reference to FIG. 1. The solid-state image sensor 100 includes a silicon substrate 101, photoelectric conversion portions 102 formed within the silicon substrate 101, an interlayer insulation film 103 which is formed on the silicon substrate 101 and made of a transmissive material, and a wiring portion 104 arranged within the interlayer insulation film 103. A planarizing layer is arranged on the upper surface of the interlayer insulation film 103. Furthermore, B, G, and R pixel color filters 105a, 105b, and 105c are arranged on the planarizing layer. Micro-lenses 106 are then arranged on the color filters 105a, 105b, and 105c. The interlayer insulation film 103 can be formed from, for example, silicon oxide ($SiO_2$). Although not shown, the solid-state image sensor 100 includes an array of a plurality of pixels. Each pixel includes the photoelectric conversion portions 102 formed in the silicon substrate 101, antireflection films 107a, 107b, and 107c arranged on the photoelectric conversion portions 102, and the color filters 105a, 105b, and 105c.

Figure 2:
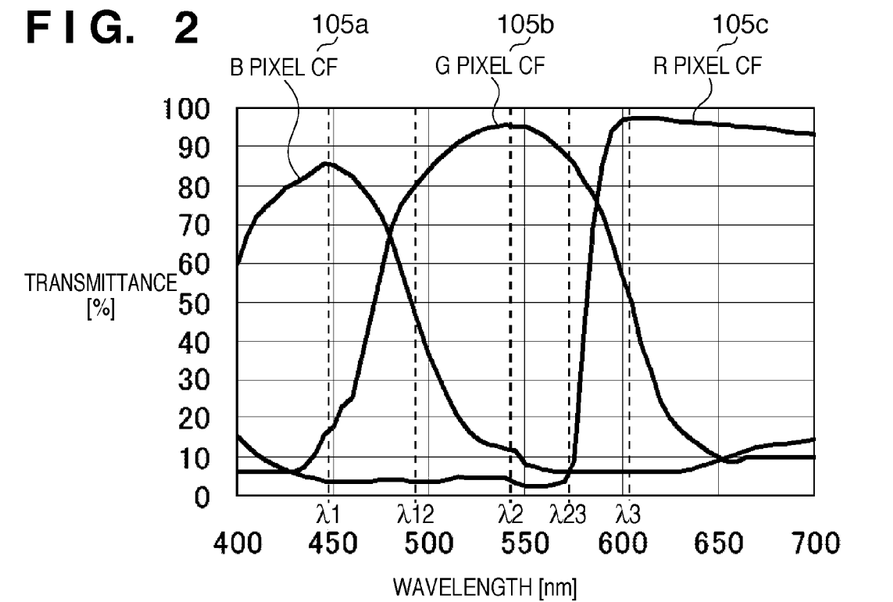
FIG. 2 is a graph showing the spectral characteristics of color filters.

FIG. 2 shows the spectral transmittances of the B, G, and R pixel color filters 105a, 105b, and 105c. Referring to FIG. 2, the abscissa indicates the wavelength and the ordinate indicates the transmittance. Assume that $\lambda 1$, $\lambda 2$, and $\lambda 3$ represent wavelengths at which the transmittances of the B, G, and R pixel color filters 105a, 105b, and 105c maximize, respectively. Assume also that $\lambda 12$ represents a central wavelength (($\lambda 1+\lambda 2$)/2) between the wavelengths $\lambda 1$ and $\lambda 2$; and $\lambda 23$, a central wavelength (($\lambda 2+\lambda 3$)/2) between the wavelengths $\lambda 2$ and $\lambda 3$. In an example shown in FIG. 2, $\lambda 1=445$ nm, $\lambda 2=540$ nm, $\lambda 3=610$ nm, $\lambda 12=492.5$ nm, and $\lambda 23=575$ nm. In this case, an overlap between the transmission band of the B pixel color filter 105a and that of the G pixel color filter 105b, and an overlap between the transmission band of the G pixel color filter 105b and that of the R pixel color filter 105c are large.

The respective antireflection films 107a, 107b, and 107c are formed between the respective B, G, and R pixel photoelectric conversion portions 102 formed within the silicon substrate 101 and the interlayer insulation film 103. The antireflection films 107a, 107b, and 107c are not limited to being arranged on the surface of the silicon substrate 101 but may be arranged at another position (the surface of the micro-lens 106), or at a plurality of positions.

As an example of the arrangement of the antireflection films 107a, 107b, and 107c, the B pixel antireflection film 107a can have, on the surface of the silicon substrate 101, a 10 nm-thick $SiO_2$ film, a 80 nm-thick SiN film, a 110 nm-thick $SiO_2$ film, and a 30 nm-thick SiN film in the order named. The G pixel antireflection film 107b can have, on the surface of the silicon substrate 101, a 10 nm-thick $SiO_2$ film, a 190 nm-thick SiN film, a 60 nm-thick $SiO_2$ film, and a 100 nm-thick SiN film in the order named. The R pixel antireflection film 107c can have, on the surface of the silicon substrate 101, a 10 nm-thick $SiO_2$ film, a 50 nm-thick SiN film, a 50 nm-thick $SiO_2$ film, and a 70 nm-thick SiN film in the order named. Note that the refractive index of $SiO_2$ is 1.46, and the refractive index of SiN is 2.03.

Figure 3:
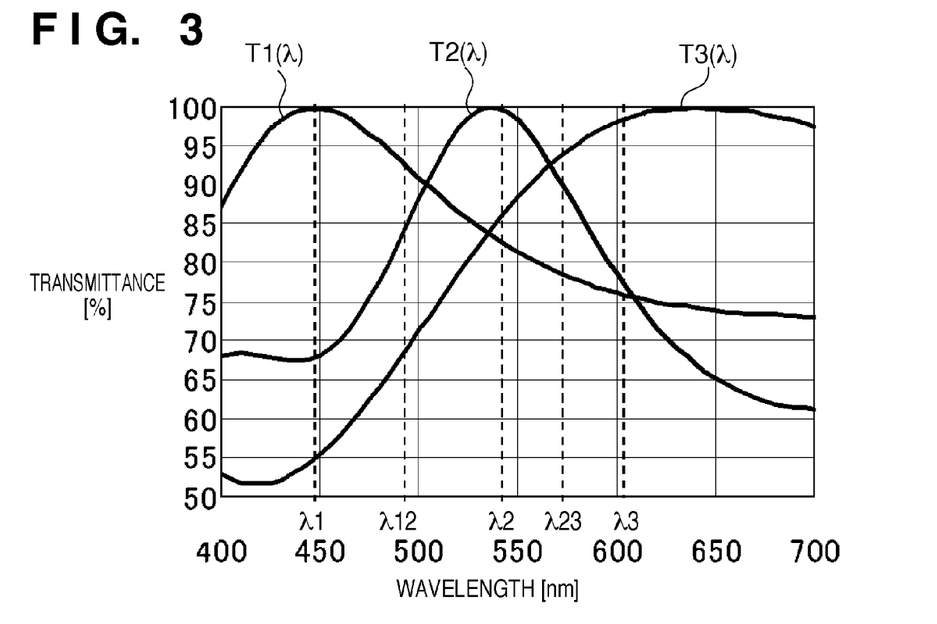
FIG. 3 is a graph showing the spectral characteristics of antireflection films according to the first embodiment.

As a function of wavelength $\lambda$, $T1(\lambda)$ can represent the transmittance (spectral transmittance) of the antireflection film 107a; $T2(\lambda)$, the transmittance (spectral transmittance) of the antireflection film 107b; and $T3(\lambda)$, the transmittance (spectral transmittance) of the antireflection film 107c. FIG. 3 shows the transmittances $T1(\lambda)$, $T2(\lambda)$, and $T3(\lambda)$ of the antireflection films 107a, 107b, and 107c, respectively. Referring to FIG. 3, the abscissa indicates the wavelength and the ordinate indicates the transmittance. FIG. 3 also shows the wavelengths $\lambda 1$, $\lambda 2$, $\lambda 3$, $\lambda 12$, and $\lambda 23$ for reference.

Assume that Tmax1, Tmax2, and Tmax3 indicate the maximum values of the transmittances $T1(\lambda)$, $T2(\lambda)$, and $T3(\lambda)$ of the color filters 105a, 105b, and 105c, respectively. In the first embodiment, Tmax1=99.9%, Tmax2=99.9%, and Tmax3=99.9%. On the wavelength $\lambda 12$, $T1(\lambda 12)=92.8\%$ and $T2(\lambda 12)=84.1\%$ are obtained for $T1(\lambda)$ and $T2(\lambda)$, respectively. On the wavelength $\lambda 23$, $T2(\lambda 23)=89.1\%$ and $T3(\lambda 23)=94.4\%$ are obtained for $T2(\lambda)$ and $T3(\lambda)$, respectively.

In the first embodiment, Tmax1, Tmax2, and Tmax3, and the transmittances $T(\lambda 12)$ and $T(\lambda 23)$ at the wavelengths $\lambda 12$ and $\lambda 23$ are set to satisfy conditions given by $$T1(\lambda 12) \leq 0.95 \cdot Tmax1 \quad \text{(Relation 1)}$$

$$T2(\lambda 12) \leq 0.95 \cdot Tmax2 \quad \text{(Relation 2)}$$

$$T2(\lambda 23) \leq 0.95 \cdot Tmax2 \quad \text{(Relation 3)}$$

$$T3(\lambda 23) \leq 0.95 \cdot Tmax3 \quad \text{(Relation 4)}$$

The above example satisfies the conditions given by Relations 1 to 4 as follows:

$$92.8\% \leq 0.95 \times 99.9\% = 94.9\%$$ (Relation 1)

$$84.1\% \leq 0.95 \times 99.9\% = 94.9\%$$ (Relation 2)

$$89.1\% \leq 0.95 \times 99.9\% = 94.9\%$$ (Relation 3)

$$94.4\% \leq 0.95 \times 99.9\% = 94.9\%$$ (Relation 4)

By satisfying the conditions indicated by Relations 1 and 2, it is possible to decrease the transmittance in a wavelength region where the transmission region of the B pixel color filter 105a and that of the G pixel color filter 105b overlap each other. By satisfying the conditions indicated by Relations 3 and 4, it is possible to decrease the transmittance in a wavelength region where the transmission region of the G pixel color filter 105b and that of the R pixel color filter 105c overlap each other. This can improve the color separation characteristics. In this case, if the coefficients of Tmax1 to Tmax4 in Relations 1 to 4 are set to be larger than 0.95, the color separation characteristics suffer.

Figure 4:
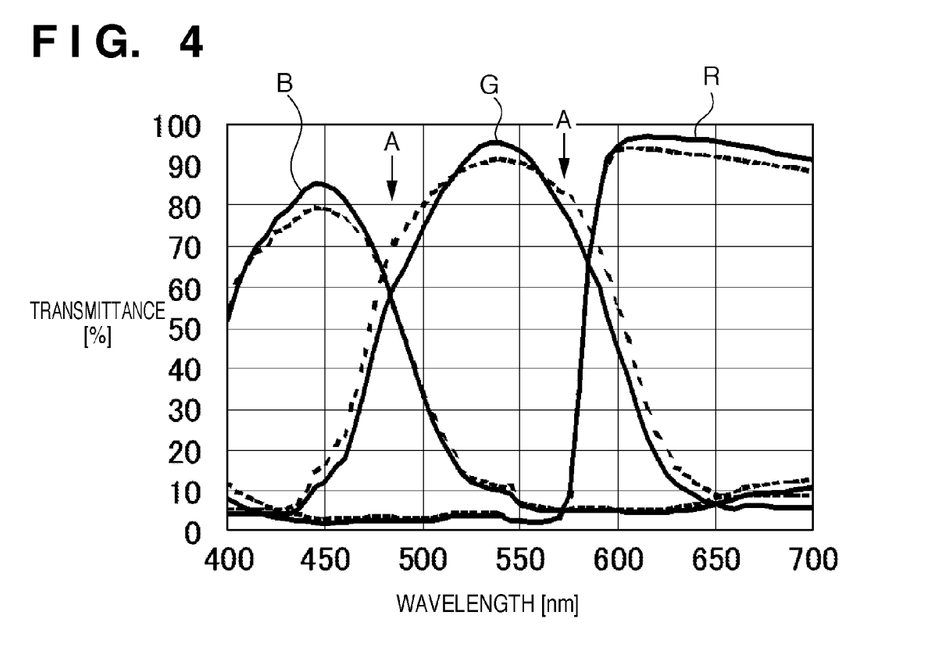
FIG. 4 is a graph showing the spectral characteristics of the solid-state image sensor according to the first embodiment.

The spectral characteristics of light entering the photoelectric conversion portions 102 of the solid-state image sensor 100 are determined by respectively multiplying the spectral transmittances of the color filters 105a, 105b, and 105c by those of the antireflection films 107a, 107b, and 107c. Solid lines in FIG. 4 indicate the spectral characteristics of light entering the photoelectric conversion portions 102 of the solid-state image sensor 100 using the antireflection films 107a, 107b, and 107c. Dotted lines in FIG. 4 represent the spectral characteristics of light entering the photoelectric conversion portions 102 of the solid-state image sensor using the antireflection films 307a, 307b, and 307c shown in FIG. 10. Referring to FIG. 4, a curve B represents the spectral transmittance obtained by multiplying the spectral transmittance of the B pixel color filter 105a by that of the B pixel antireflection film 107a, that is, the spectral characteristics of light entering the B pixel photoelectric conversion portion 102. Referring to FIG. 4, a curve G indicates the spectral transmittance obtained by multiplying the spectral transmittance of the G pixel color filter 105b by that of the G pixel antireflection film 107b, that is, the spectral characteristics of light entering the G pixel photoelectric conversion portion 102. Referring to FIG. 4, a curve R represents the spectral transmittance obtained by multiplying the spectral transmittance of the R pixel color filter 105c by that of the R pixel antireflection film 107c, that is, the spectral characteristics of light entering the R pixel photoelectric conversion portion 102.

As seen in regions indicated by A in FIG. 4, in the solid-state image sensor 100 using the antireflection films 107a, 107b, and 107c represented by solid lines, an overlap between the transmission bands of pixels B and G is small. That is, transmittance is small at the wavelength where the spectral transmittance of pixels B and G intersect each other. In the solid-state image sensor 100 using the antireflection films 107a, 107b, and 107c represented by the solid lines, an overlap between the transmission bands of pixels G and R is also small. That is, transmittance is small at the wavelength at where spectral transmittance of pixels G and R intersect each other. Furthermore, in the solid-state image sensor 100 using the antireflection films 107a, 107b, and 107c represented by the solid lines, the maximum transmittances of the R, G, and B pixels have improved. This is because it is possible to increase the peak transmittances by forming the antireflection films 107a, 107b, and 107c as multilayered films with three or more layers to narrow the bandwidth of light transmitted by the antireflection films 107a, 107b, 107c.

As described above, it is possible to improve the color separation characteristics while increasing the sensitivities of R, G, and B pixels by configuring the antireflection films 107a, 107b, and 107c so as to satisfy Relations 1, 2, 3, and 4. This enables the obtainment of an imaging signal with high sensitivity and high color reproduction.

The technique associated with the solid-state image sensor according to the first embodiment is also applicable to a backside illuminated solid-state image sensor, a solid-state image sensor with a waveguide structure, or the like.

In the first embodiment, SiN and $SiO_2$ are used as materials of an antireflection film. The present invention, however, is not limited to them, and other materials may form an antireflection film. The thickness of an antireflection film is not limited to the above numeric values, and other thicknesses may be used as long as they satisfy Relations 1 to 4.

Second Embodiment

A solid-state image sensor 200 according to the second embodiment of the present invention will be described with reference to FIG. 5. The solid-state image sensor 200 of the second embodiment has an arrangement obtained by substituting a common antireflection film 207 for the three types of antireflection films 107a, 107b, and 107c in the first embodiment. That is, in the second embodiment, the common (same) antireflection film 207 is provided for R, G, and B pixels. The antireflection film 207 is not limited to be arranged on the surface of a silicon substrate 101 but may be arranged at another position (the surface of a micro-lens 106), or at a plurality of positions. The spectral transmittances of color filters 105a, 105b, and 105c in the second embodiment can have the spectral characteristics shown in FIG. 2.

In the second embodiment, $\lambda 1=445$ nm, $\lambda 2=540$ nm, $\lambda 3=610$ nm, $\lambda 12=492.5$ nm, and $\lambda 23=575$ nm. As an example of the arrangement of the antireflection film 207, the antireflection film 207 may have, on the surface of the silicon substrate 101, a 10 nm-thick $SiO_2$ film, a 50 nm-thick SiN film, a 80 nm-thick $SiO_2$ film, a 145 nm-thick SiN film, a 205 nm-thick $SiO_2$ film, and a 315 nm-thick SiN film in the order named. Note that the refractive index of $SiO_2$ is 1.46 and the refractive index of SiN is 2.03.

In the first embodiment, the four-layer antireflection film is formed for each of the R, G, and B pixels. Therefore, a mask for creating each of the R, G, and B pixel antireflection films is needed. The total number of layers forming an antireflection film for the tree types of pixels is 4 layers×3 pixels (RGB)=12. In the second embodiment, since the common antireflection film 207 is provided for the R, G, and B pixels, a mask for creating the antireflection film 207 is unnecessary, and only six layers in total are stacked. Consequently, it is possible to decrease the number of processes as compared with the first embodiment.

Figure 6:
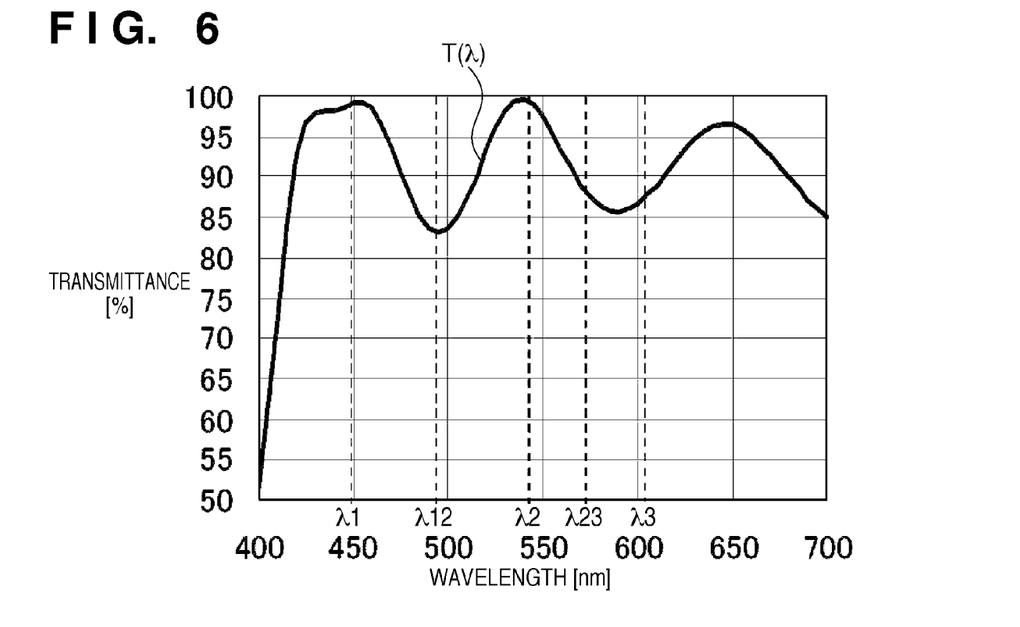
FIG. 6 is a graph showing the spectral characteristics of an antireflection film according to the second embodiment.

In this case, it is possible to represent the transmittance (spectral transmittance) of the antireflection film 207 by $T(\lambda)$ as a function of a wavelength $\lambda$. FIG. 6 shows the transmittance $T(\lambda)$ of the antireflection film 207. Referring to FIG. 6, the abscissa indicates the wavelength and the ordinate indicates the transmittance. FIG. 6 also shows, for reference, wavelengths $\lambda 1$, $\lambda 2$, and $\lambda 3$ at which the maximum transmittances of the color filters are obtained, and the central wavelengths $\lambda 12$ and $\lambda 23$ shown in FIG. 2. As shown in FIG. 6, the antireflection film 207 of the second embodiment is configured to have local maximum values in blue, green, and red regions. Assume that Tmax1, Tmax2, and Tmax3 indicate the local maximum values of the transmittances from the side of shorter wavelength. In this case, Tmax1=99.4%, Tmax2=99.7%, Tmax3=96.4%. The transmittance at the central wavelength λ12 between the wavelengths λ1 and λ2 is T(λ12)=83.9% and the transmittance at the central wavelength λ23 between the wavelengths λ2 and λ3 is T(λ23)=87.5%. The values Tmax1, Tmax2, and Tmax3, the transmittances T(λ12) at the wavelength λ12, and the transmittances T(λ23) at the wavelength λ23 are set to satisfy conditions given by relations 5 and 6. Since in the second embodiment, the R, G, and B pixel antireflection films have the same (common) structure, this is also considered a case in which T(λ)=T1(λ)=T2(λ)=T3(λ) holds in the first embodiment.

$$T(\lambda 12) \leq 0.95 \cdot T\text{max}1 \quad \text{(Relation 5)}$$

$$T(\lambda 23) \leq 0.95 \cdot T\text{max}2 \quad \text{(Relation 6)}$$

The above example satisfies the conditions indicated by Relations 5 and 6.

$$83.9\% \leq 0.95 \times 99.4\% = 94.4\% \quad \text{(Relation 5)}$$

$$87.5\% \leq 0.95 \times 96.4\% = 91.6\% \quad \text{(Relation 6)}$$

Figure 7:
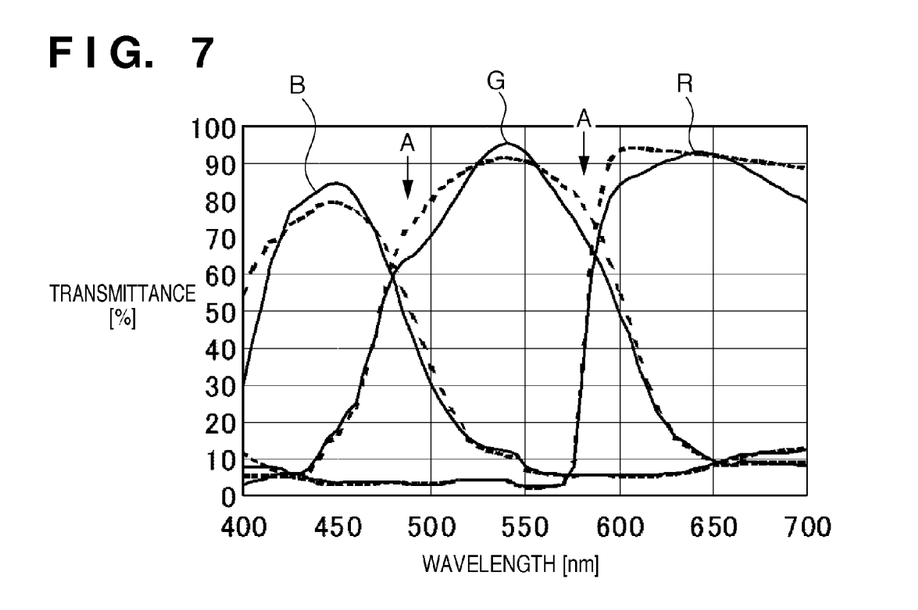
FIG. 7 is a graph showing the spectral characteristics of the solid-state image sensor according to the second embodiment.

The spectral characteristics of light entering photoelectric conversion portions 102 of the solid-state image sensor 200 are determined by multiplying the respective spectral transmittances of the color filters 105a, 105b, and 105c by that of the antireflection film 207. Solid lines in FIG. 7 represent the spectral characteristics of light entering the photoelectric conversion portions 102 of the solid-state image sensor 200 using the antireflection film 207. As a comparative example, dotted lines in FIG. 7 indicate the spectral characteristics of light entering the photoelectric conversion portions 102 of the solid-state image sensor using the antireflection films 307a, 307b, and 307c shown in FIG. 10. Referring to FIG. 7, a curve B represents the spectral transmittance obtained by multiplying the spectral transmittance of the B pixel color filter 105a by that of the antireflection film 207, that is, the spectral characteristics of light entering the B pixel photoelectric conversion portion 102. Referring to FIG. 7, a curve G indicates the spectral transmittance obtained by multiplying the spectral transmittance of the G pixel color filter 105b by that of the antireflection film 207, that is, the spectral characteristics of light entering the G pixel photoelectric conversion portion 102. Referring to FIG. 7, a curve R represents the spectral transmittance obtained by multiplying the spectral transmittance of the R pixel color filter 105c by that of the antireflection film 207, that is, the spectral transmittance characteristics of light entering the R pixel photoelectric conversion portion 102.

As seen in regions indicated by A in FIG. 7, the overlap between the transmission bands of pixels B and G is small in the solid-state image sensor 200 that uses the antireflection film 207 represented by the solid lines. That is, the transmittance is small at the wavelength where the spectral transmittance of pixels B and G intersect each other. In the solid-state image sensor 200 using the antireflection film 207 represented by the solid lines, the overlap between transmission bands of the G and R pixels is also small. That is, the transmittance at a wavelength at which the spectral transmittances of pixels G and R intersect each other is small. Furthermore, in the solid-state image sensor 200 using the antireflection film 207 represented by the solid lines, the maximum transmittances of the R, G, and B pixels have improved.

As described above, it is possible to improve the color separation characteristics while increasing the sensitivities of the R, G, and B pixels by configuring the antireflection films 107a, 107b, and 107c so as to satisfy Relations 5 and 6. Using a common antireflection film for all the pixels eliminates the need to use a mask for creating the antireflection film. This makes it possible to decrease the number of processes as compared with a case in which the arrangement of an antireflection film is different for each pixel.

The technique associated with the solid-state image sensor according to the second embodiment is also applicable to a backside illuminated solid-state image sensor, a solid-state image sensor with a waveguide structure, or the like.

In the second embodiment, SiN and $SiO_2$ are used as materials of antireflection films. The present invention, however, is not limited to them, and other materials may form the antireflection film. The thickness of an antireflection film is not limited to the above numeric values, and other thicknesses may be used as long as they satisfy Relations 5 and 6.

Other Embodiments

The first and second embodiments have been explained in terms of improvement in color separation characteristics in the R, G, and B pixels. When considering improvement in color separation characteristics in any two types of color filters, the following explanation is possible. A solid-state image sensor includes first-color pixels and second-color pixels. Each of the first-color pixels includes, on a photoelectric conversion portion 102, the first antireflection film (for example, 107a) and the first color filter (for example, 105a). Each of the second-color pixels includes, on a photoelectric conversion portion 102, the second antireflection film (for example, 107b) and the second color filter (for example, 105b). Assume that when representing a wavelength by λ, T1(λ) and T2(λ) respectively indicate the transmittances of the first and second antireflection films, and Tmax1 and Tmax2 respectively indicate maximum values of T1(λ) and T2(λ). Assume also that λ1 and λ2 represent wavelengths at which the transmittances of the first and second color filters are respectively maximized, and λ12 represents the central wavelength between the wavelengths λ1 and λ2. In this case, in the solid-state image sensor, the values Tmax1 and Tmax2, and the transmittances T1(λ12) and T2(λ12) on the wavelength λ12 satisfy conditions given by $$T1(\lambda 12) \leq 0.95 \cdot T\text{max}1 \quad \text{(Relation 1')}$$

$$T2(\lambda 12) \leq 0.95 \cdot T\text{max}2 \quad \text{(Relation 2')}$$

It is also possible to consider improvement in color separation characteristics in any three types of color filters. The solid-state image sensor includes third-color pixels in addition to the first-color pixels and the second-color pixels. Each of the third-color pixels includes, on a photoelectric conversion portion 102, the third antireflection film (for example, 107c) and the third color filter (for example, 105c). Assume that T3 (λ) represents the transmittance of the third antireflection film; Tmax3, the maximum value of T3(λ); λ3, the wavelength at which the transmittance of the third color filter is maximized; and λ13, the central wavelength between the wavelengths λ2 and λ3. In this case, the solid-state image sensor satisfies conditions given by Relations 1' to 4' similar to Relations 1 to 4.

$$T1(\lambda 12) \leq 0.95 \cdot T\text{max}1 \quad \text{(Relation 1')}$$

$$T2(\lambda 12) \leq 0.95 \cdot T\text{max}2 \quad \text{(Relation 2')}$$

$$T2(\lambda 23) \leq 0.95 \cdot T\text{max}2 \quad \text{(Relation 3')}$$

$$T3(\lambda 23) \leq 0.95 \cdot T\text{max}3 \quad \text{(Relation 4')}$$

The second embodiment is a case in which $T1(\lambda)=T2(\lambda)=T3(\lambda)$, for example, a case in which R, G, B pixel antireflection films have the same (common) structure.

Assume that the first antireflection film (for example, an antireflection film arranged between a silicon substrate 101 and an interlayer insulation film 103, and an antireflection film arranged on a micro-lens) is included. In this case, if $t1n(\lambda)$ represents each of the transmittances of the plurality of antireflection films, the following equation is obtained:

$$T1(\lambda)=t11(\lambda) \times t12(\lambda) \times t13(\lambda) \ldots \times t1N(\lambda)$$

where N represents the number of antireflection films forming the first antireflection film.

Similarly, assume that the second antireflection film (for example, an antireflection film arranged between the silicon substrate 101 and the interlayer insulation film 103, and an antireflection film arranged on a micro lens) is included. In this case, if $t2n(\lambda)$ represents each of the transmittances of the plurality of antireflection films, the following equation is obtained:

$$T2(\lambda)=t21(\lambda) \times t22(\lambda) \times t23(\lambda) \ldots t2N(\lambda)$$

where N represents the number of antireflection films forming the second antireflection film.

Similarly, assume that the third antireflection film (for example, an antireflection film arranged between the silicon substrate 101 and the interlayer insulation film 103, and an antireflection film arranged on a micro lens) is included. In this case, if $t3n(\lambda)$ represents each of the transmittances of the plurality of antireflection films, the following equation is obtained:

$$T3(\lambda)=t31(\lambda) \times t32(\lambda) \times t33(\lambda) \ldots \times t3N(\lambda)$$

where N represents the number of antireflection films forming the third antireflection film.

Application Example

As an Application Example of a solid-state image sensor according to each embodiment described above, a camera including the solid-state image sensor will be described. The camera conceptually includes not only a device which principal purpose is photographing but also a device (for example, a personal computer or portable terminal) additionally provided with the photographing function. The camera includes the solid-state image sensor according to the present invention, which has been exemplified in the above embodiments, and a processor for processing a signal output from the solid-state image sensor. The processor can include, for example, an A/D converter, and a processor module for processing digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-178076, filed Aug. 6, 2010, which is hereby incorporated by reference herein in its entirety.

What is claimed is:

1. A solid-state image sensor comprising a plurality of pixels,
wherein the plurality of pixels includes a first pixel and a second pixel,
wherein the first pixel includes an antireflection structure and a first color filter,
wherein the second pixel includes an antireflection structure and a second color filter,
wherein the solid-state image sensor satisfies:

$$T1(\lambda 12) \leq 0.95 \cdot T\text{max}1, \text{ and}$$

$$T2(\lambda 12) \leq 0.95 \cdot T\text{max}2,$$

where $\lambda 1$ represents a wavelength at which a transmittance of the first color filter is maximized, $\lambda 2$ represents a wavelength at which a transmittance of the second color filter is maximized, and $\lambda 12$ represents a central wavelength between wavelengths $\lambda 1$ and $\lambda 2$,
$T1(\lambda)$ represents a transmittance of the antireflection structure of the first pixel, and $T2(\lambda)$ represents a transmittance of the antireflection structure of the second pixel, where $\lambda$ represents a wavelength, and
$T\text{max}1$ represents a maximum value of the transmittance $T1(\lambda)$, and $T\text{max}2$ represents a maximum value of the transmittance $T2(\lambda)$, and
wherein the antireflection structure of the first pixel and the antireflection structure of the second pixel have a same structure.

2. The solid-state image sensor according to claim 1, wherein each of the antireflection structure of the first pixel and the antireflection structure of the second pixel includes a multilayered film.

3. The solid-state image sensor according to claim 1,
wherein the plurality of pixels further include a third pixel, and the third pixel includes an antireflection structure and a third color filter, and
wherein the solid-state image sensor satisfies:

$$T2(\lambda 23) \leq 0.95 \cdot T\text{max}2, \text{ and}$$

$$T3(\lambda 23) \leq 0.95 \cdot T\text{max}3, \text{ where}$$

$\lambda 3$ represents a wavelength at which a transmittance of the third color filter is maximized,
$\lambda 23$ represents a central wavelength between the wavelengths $\lambda 2$ and $\lambda 3$,
$T3(\lambda)$ represents a transmittance of the antireflection structure of the third pixel, and
$T\text{max}3$ represents a maximum value of the transmittance $T3(\lambda)$.

4. The solid-state image sensor according to claim 3, wherein the antireflection structure of the first pixel, the antireflection structure of the second pixel, and the antireflection structure of the third pixel have a same structure as each other.

5. The solid-state image sensor according to claim 3, wherein each of the antireflection structure of the first pixel, the antireflection structure of the second pixel, and the antireflection structure of the third pixel has a plurality of antireflection films.

6. A camera comprising:
a solid-state image sensor including a plurality of pixels,
wherein the plurality of pixels includes a first pixel and a second pixel,
wherein the first pixel includes an antireflection structure and a first color filter,
wherein the second pixel includes an antireflection structure and a second color filter,
wherein the solid-state image sensor satisfies:

$$T1(\lambda 12) \leq 0.95 \cdot T\text{max}1, \text{ and}$$

$$T2(\lambda 12) \leq 0.95 \cdot T\text{max}2,$$

where $\lambda 1$ represents a wavelength at which a transmittance of the first color filter is maximized, $\lambda 2$ represents a wavelength at which a transmittance of the second color filter is maximized, and λ12 represents a central wavelength between wavelengths λ1 and λ2, T1(λ) represents a transmittance of the antireflection structure of the first pixel, and T2(λ) represents a transmittance of the antireflection structure of the second pixel, where λ represents a wavelength, and Tmax1 represents a maximum value of the transmittance T1(λ), and Tmax2 represents a maximum value of the transmittance T2(λ), and wherein the antireflection structure of the first pixel and the antireflection structure of the second pixel have a same structure; and a processor that processes a signal output from the solid-state image sensor.

7. A solid-state image sensor comprising a plurality of pixels, wherein the plurality of pixels includes a first pixel, a second pixel, and a third pixel, wherein the first pixel includes an antireflection structure and a first color filter, a transmittance of the first color filter being maximized at a wavelength λ1, wherein the second pixel includes an antireflection structure and a second color filter, a transmittance of the second color filter being maximized at a wavelength λ2, and wherein the third pixel includes an antireflection structure and a third color filter, a transmittance of the third color filter being maximized at a wavelength λ3, wherein the wavelength λ2 is between the wavelength λ1 and the wavelength λ3, and the solid-state image sensor satisfies:

$$T2(\lambda 12) \leq 0.95 \cdot Tmax2,$$

where T2(λ12) represents a transmittance of the antireflection structure of the second pixel at a wavelength λ12, which represents a central wavelength between the wavelength λ1 and the wavelength λ2, and Tmax2 represents a maximum value of the transmittance of the antireflection structure of the second pixel, and wherein the antireflection structure of the first pixel and the antireflection structure of the third pixel are in common.

8. The solid-state image sensor according to claim 7, wherein the solid-state image sensor satisfies:

$$T2(\lambda 23) \leq 0.95 Tmax2,$$

where T2(λ23) represents the transmittance of the antireflection structure of the second pixel at a wavelength λ23, which represents the central wavelength between the wavelength λ2 and the wavelength λ3.

9. The solid-state image sensor according to claim 7, wherein the wavelength λ1 is shorter than the wavelength λ3.

10. The solid-state image sensor according to claim 7, wherein the antireflection structure of the second pixel includes a multilayered film.

11. A camera comprising:

a solid-state image sensor including a plurality of pixels,
wherein the plurality of pixels includes a first pixel, a second pixel, and a third pixel,
wherein the first pixel includes an antireflection structure and a first color filter, a transmittance of the first color filter being maximized at a wavelength λ1,
wherein the second pixel includes an antireflection structure and a second color filter, a transmittance of the second color filter being maximized at a wavelength λ2, and wherein the third pixel includes an antireflection structure and a third color filter, a transmittance of the third color filter being maximized at a wavelength λ3,
wherein the wavelength λ2 is between the wavelength λ1 and the wavelength λ3, and the solid-state image sensor satisfies:

$$T2(\lambda 12) \leq 0.95 \cdot Tmax2,$$

where T2(λ12) represents a transmittance of the antireflection structure of the second pixel at a wavelength λ12, which represents a central wavelength between the wavelength λ1 and the wavelength λ2, and Tmax2 represents a maximum value of the transmittance of the antireflection structure of the second pixel, and wherein the antireflection structure of the first pixel and the antireflection structure of the third pixel are in common; and a processor that processes a signal output from the solid-state image sensor.

12. A solid-state image sensor comprising a plurality of pixels, wherein the plurality of pixels includes a first pixel, a second pixel, and a third pixel, wherein the first pixel includes an antireflection structure and a first color filter, a transmittance of the first color filter being maximized at a wavelength λ1, wherein the second pixel includes an antireflection structure and a second color filter, a transmittance of the second color filter being maximized at a wavelength λ2, and wherein the third pixel includes an antireflection structure and a third color filter, a transmittance of the third color filter being maximized at a wavelength λ3, and wherein the wavelength λ1 is shorter than the wavelength λ2, the wavelength λ2 is shorter than the wavelength λ3, and the solid-state image sensor satisfies:

$$T1(\lambda 23) \leq T2(\lambda 23) \leq 0.95 \cdot Tmax2,$$

where T1(λ3) represents a transmittance of the antireflection structure of the first pixel at a wavelength λ23, which is a central wavelength between the wavelength λ2 and the wavelength λ3, T2(λ23) represents a transmittance of the antireflection structure of the second pixel at the wavelength λ23, and Tmax2 represents maximum values of the transmittance of the antireflection structure of the second pixel.

13. The solid-state image sensor according to claim 12, wherein the solid-state image sensor satisfies:

$$T3(\lambda 23) \leq 0.95 \cdot Tmax3,$$

where T3(λ23) represents a transmittance of the antireflection structure of the third pixel at the wavelength λ23, and Tmax3 represents a maximum value of the transmittance of the antireflection structure of the second pixel.

14. The solid-state image sensor according to claim 12, wherein the solid-state image sensor satisfies:

$$T2(\lambda 23) \leq T3(\lambda 23),$$

where T3(λ23) represents a transmittance of the antireflection structure of the third pixel at the wavelength λ23.

15. The solid-state image sensor according to claim 12, wherein the solid-state image sensor satisfies:

$$T3(\lambda 12) \leq T2(\lambda 12) \leq 0.95 \cdot Tmax2,$$

where T3(λ12) represents a transmittance of the antireflection structure of the third pixel at the wavelength λ12, which is a central wavelength between the wavelength λ1 and the wavelength λ2, and T2(λ12) represents a transmittance of the antireflection structure of the second pixel at the wavelength $\lambda 12$.

16. The solid-state image sensor according to claim 12, wherein the antireflection structure of the second pixel includes a multilayered film.

17. A camera comprising:

a solid-state image sensor including a plurality of pixels, wherein the plurality of pixels includes a first pixel, a second pixel, and a third pixel, wherein the first pixel includes an antireflection structure and a first color filter, a transmittance of the first color filter being maximized at a wavelength $\lambda 1$, wherein the second pixel includes an antireflection structure and a second color filter, a transmittance of the second color filter being maximized at a wavelength $\lambda 2$, and wherein the third pixel includes an antireflection structure and a third color filter, a transmittance of the third color filter being maximized at a wavelength $\lambda 3$, and wherein the wavelength $\lambda 1$ is shorter than the wavelength $\lambda 2$, the wavelength $\lambda 2$ is shorter than the wavelength $\lambda 3$, and the solid-state image sensor satisfies:

$$T1(\lambda 23) \le T2(\lambda 23) \le 0.95 \cdot Tmax2,$$

where $T1(\lambda 23)$ represents a transmittance of the antireflection structure of the first pixel at a wavelength $\lambda 23$, which is a central wavelength between the wavelength $\lambda 2$ and the wavelength $\lambda 3$, $T2(\lambda 23)$ represents a transmittance of the antireflection structure of the second pixel at the wavelength $\lambda 23$, and $Tmax2$ represents maximum values of the transmittance of the antireflection structure of the second pixel; and a processor that processes a signal output from the solid-state image sensor.

* * * * *